(12) United States Patent
Liaw

(10) Patent No.: US 10,529,414 B2
(45) Date of Patent: Jan. 7, 2020

(54) SRAM CELL HAVING SIGE PMOS FIN LINES

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/993,855

(22) Filed: May 31, 2018

(65) Prior Publication Data

US 2019/0371393 A1 Dec. 5, 2019

(51) Int. Cl.
| G11C 11/00 | (2006.01) |
| G11C 11/412 | (2006.01) |
| H01L 29/78 | (2006.01) |
| G11C 7/12 | (2006.01) |
| H01L 27/11 | (2006.01) |

(52) U.S. Cl.
CPC .......... G11C 11/412 (2013.01); G11C 7/12 (2013.01); H01L 27/1104 (2013.01); H01L 29/7848 (2013.01)

(58) Field of Classification Search
CPC ..... G11C 11/412; G11C 7/12; H01L 27/1104; H01L 29/7848
USPC ...................................................... 365/154
See application file for complete search history.

(56) References Cited

U.S. PATENT DOCUMENTS

| 8,084,818 B2* | 12/2011 | Shaheen ........... H01L 21/76243 257/347 |
| 8,772,109 B2 | 7/2014 | Colinge |
| 8,779,528 B2 | 7/2014 | Liaw |
| 8,785,285 B2 | 7/2014 | Tsai et al. |
| 8,796,666 B1 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,830,732 B2 | 9/2014 | Liaw |
| 8,860,148 B2 | 10/2014 | Hu et al. |
| 8,963,258 B2 | 2/2015 | Yu et al. |
| 8,964,457 B2 | 2/2015 | Liaw |
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |

(Continued)

*Primary Examiner* — Tha-O H Bui
(74) *Attorney, Agent, or Firm* — Haynes and Boone, LLP

(57) ABSTRACT

The present application provides a static random access memory (SRAM) cell. In one embodiment, the SRAM cell includes a first pass-gate field effect transistor (FET) and a first pull-up FET formed over at least one SiGe fin in a first N-type well (N-well) region; a second pass-gate FET and a second pull-up FET formed over at least one SiGe fin in a second N-well region; a first pull-down FET formed over one of a plurality of Si fins in a P-type well (P-well) region between the first and second N-well regions; and a second pull-down FET formed over another of the plurality of Si fins in the P-well region. Channel regions and source/drain regions of the first and second pass-gate FETs and the first and second pull-up FETs include SiGe alloys of different compositions or different impurity doping levels.

20 Claims, 9 Drawing Sheets

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |
| 2014/0153322 A1* | 6/2014 | Liaw .................... G11C 11/412 365/156 |

* cited by examiner

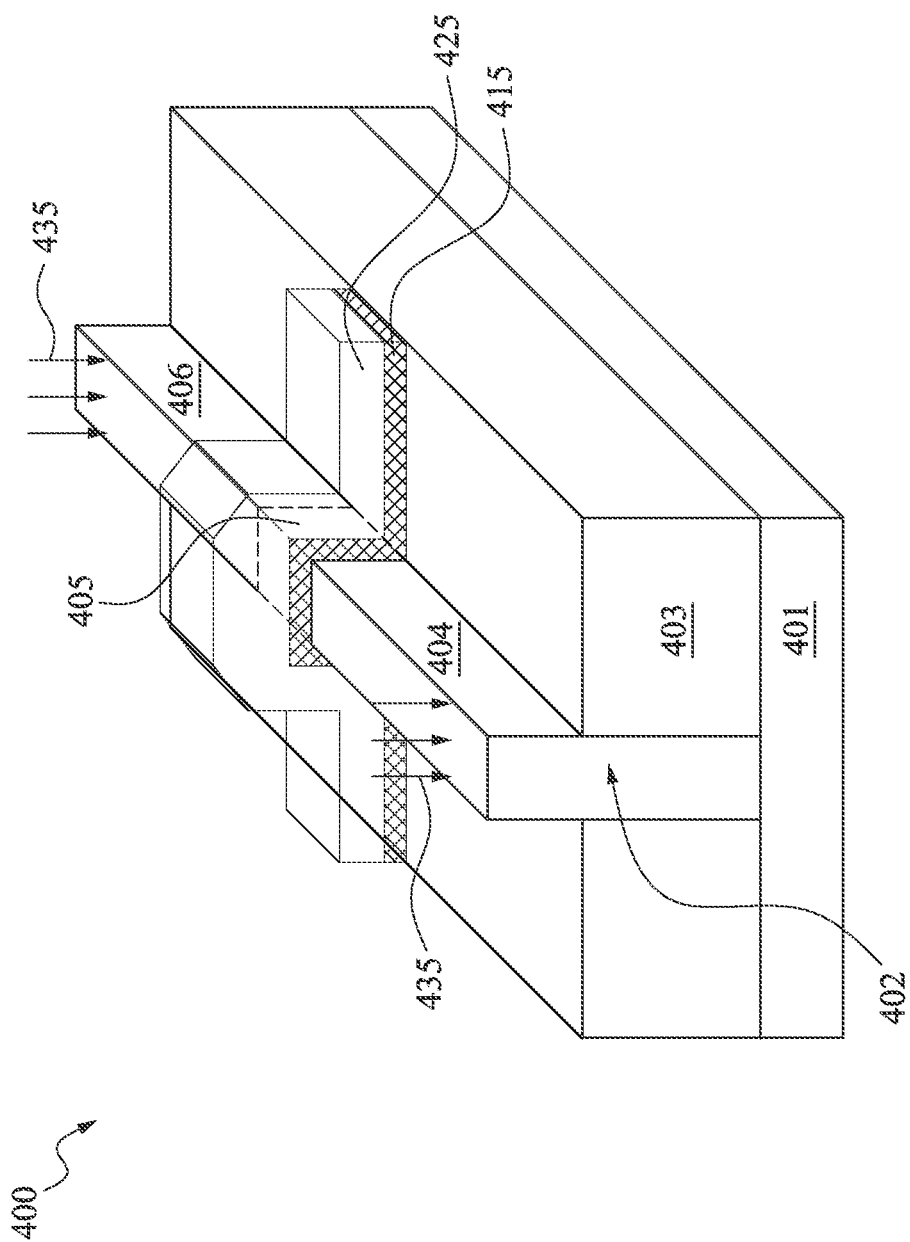

SRAM CELL HAVING SIGE PMOS FIN LINES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, in deep sub-micron integrated circuit technology, a static random access memory (SRAM) cell has become a popular storage unit of high speed communication, image processing and system-on-chip (SOC) products. The amount of SRAMs in microprocessors and SOCs increases to meet the performance requirement in each new technology generation. Although existing SRAM cells have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 4A and 4B are schematic perspectives view of a Field Effect Transistor (FET) of an exemplary SRAM cell in accordance with some embodiments of the present disclosure.

DETAILED DESCRIPTION

Figure 1A:
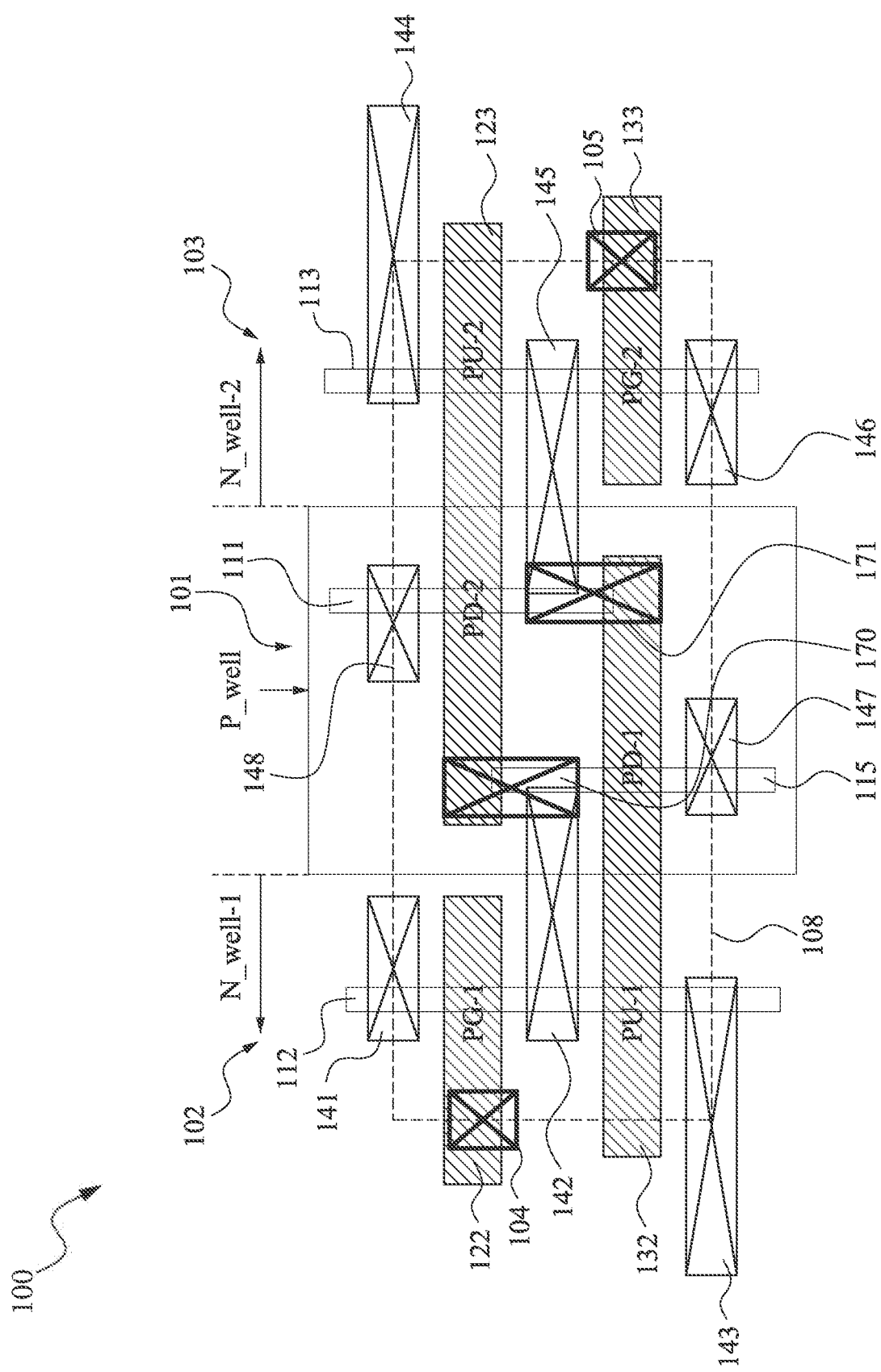
FIG. 1A illustrates a layout of an exemplary SRAM cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, an SRAM cell comprising FETs. The FETs, for example, may be a complementary metal-oxide-semiconductor (CMOS) device including a P-type metal-oxide-semiconductor (PMOS) FET and an N-type metal-oxide-semiconductor (NMOS) FET. The FETs, for example, may be fin-like FETs (FinFETs), or nano-wire FETs, or nano-sheet FETs, depending on the shape of channel region of the FETs. The following disclosure will continue with one or more FinFET examples to illustrate various embodiments of the present disclosure. It is understood, however, that the application should not be limited to a particular type of device, except as specifically claimed.

Referring now to FIG. 1A, shown therein is a layout of an example SRAM cell 100 in accordance with some embodiments of the present disclosure. An SRAM cell, as used herein, may refer to an SRAM standard cell in an IC layout. In some embodiments, the SRAM cell 100 includes a plurality of FETs in the boundaries 108 illustrated in dashed lines. In at least some embodiments as represented in FIG. 1A, the SRAM cell 100 may include six FETs in the dash-line boundaries 108. In some implementations, the SRAM cell 100 is formed over a P-type well (P-well) region 101 sandwiched between a first N-type well (N-well) region 102 and a second N-well region 103. The P-well region 101, the first N-well region 102 and the second N-well region 103 are formed over a substrate or a wafer. As shown in FIG. 1A, the SRAM cell 100 includes fin 111 and 115 in the P-well region 101. The fins 111 and 115 include silicon (Si) and may be referred to as the Si fin 111 and the Si fin 115. In some implementations, the fins 111 and 115 are substantially free of Ge. In other words, no Ge is intentionally introduced in the fins 111 and 115 in those implementations. The SRAM cell 100 also includes at least one fin 112 in the first N-well region 102 and at least one fin 113 in the second N-well region 103. In some implementations, the fins 112 and 113 include Si and germanium (Ge) or a SiGe alloy and may be referred to as the SiGe fin 112 and the SiGe fin 113.

In the embodiments represented by FIG. 1A, the SRAM cell 100 includes a first P-type pass-gate FET ("PG-1"), a first P-type pull-up FET ("PU-1"), a first N-type pull-down FET ("PD-1"), a second N-type pull-down FET ("PD-2"), a second P-type pass-gate FET ("PG-2"), and a second P-type pull-up FET ("PU-2"). In these embodiments, PG-1 and PU-1 are formed over the SiGe fin 112 in the first N-well region 102 and are controlled by a gate electrode 122 and a gate electrode 132, respectively. Further, PD-1 and PD-2 are formed over the Si fin 115 and the Si fin 111, respectively in the P-well region 101, and controlled by the gate electrode 132 and the gate electrode 123, respectively. Still further, PU-2 and PG-2 are formed over the SiGe fin 113 in the second N-well region 103 and are controlled by the gate electrode 123 and a gate electrode 133, respectively. It is noted that in these embodiments, PU-1 and PD-1 share the same gate electrode 132, and PD-2 and PU-2 share the same gate electrode 123. It is also noted that because PG-1, PG-2, PU-1, and PU-2 are formed over SiGe fins, they have SiGe channels.

In some instances, the SRAM cell 100 includes a bit-line (BL) node 141, a storage node 142, a first CVdd node 143, a second CVdd node 144, a storage node bar 145, a bit-line bar (BLB) node 146, a first CVss node 147, and a second CVss node 148. Also, some other nodes such as Word-line contacts 104 and 105 are also illustrated in FIG. 1A. In the present embodiments, a butted contact plug 170 couples the gate electrode 123 to the drain region of PD-1 controlled via the gate electrode 132. Further, a butted contact plug 171 couples the gate electrode 132 to the drain region of PD-2 controlled via the gate electrode 123. The butted contact plugs 170 and 171 may be replaced with other types of connection structures in some embodiments.

In some implementations represented in FIG. 1A, within the first N-well region 102, the SiGe fin 112 is continuous along the "Y" direction between upper and lower portions of the boundaries 108 that extend along the "X" direction. Similarly, within the second N-well region 103, the SiGe fin 113 is continuous along the "Y" direction between the upper and lower portions of the boundaries 108 that extend along the "X" direction. As used herein, the reference to upper and lower portions is merely for the ease of reference with respect to FIG. 1A and should not be considered limiting the orientation of the SRAM cell 100. In this regard, the SiGe fins 112 and 113 are continuous in the sense that they are not subject to cuts along the "X" direction or are cut or trimmed short on either ends. In contrast, the Si fins 111 and 115 are not continuous within the boundaries 108. For example, while one end (the lower end in FIG. 1A) of the Si fin 115 reaches the lower portion of the boundaries 108, the other end (the upper end in FIG. 1A) does not reach the upper portion of the boundaries 108. As the SiGe fins 112 and 113 in embodiments of the present disclosure are strained, cutting them would release the built-in strain and impact the performance of the P-type FETs PU-1 and PU-2 and the P-type FETs PG-1 and PG-2. Because no lattice strain is intentionally introduced to the Si fins 111 and 115, the Si fins 111 and 115 are not as sensitive to cutting and trimming as the SiGe fins 112 and 113 are.

Figure 1B:
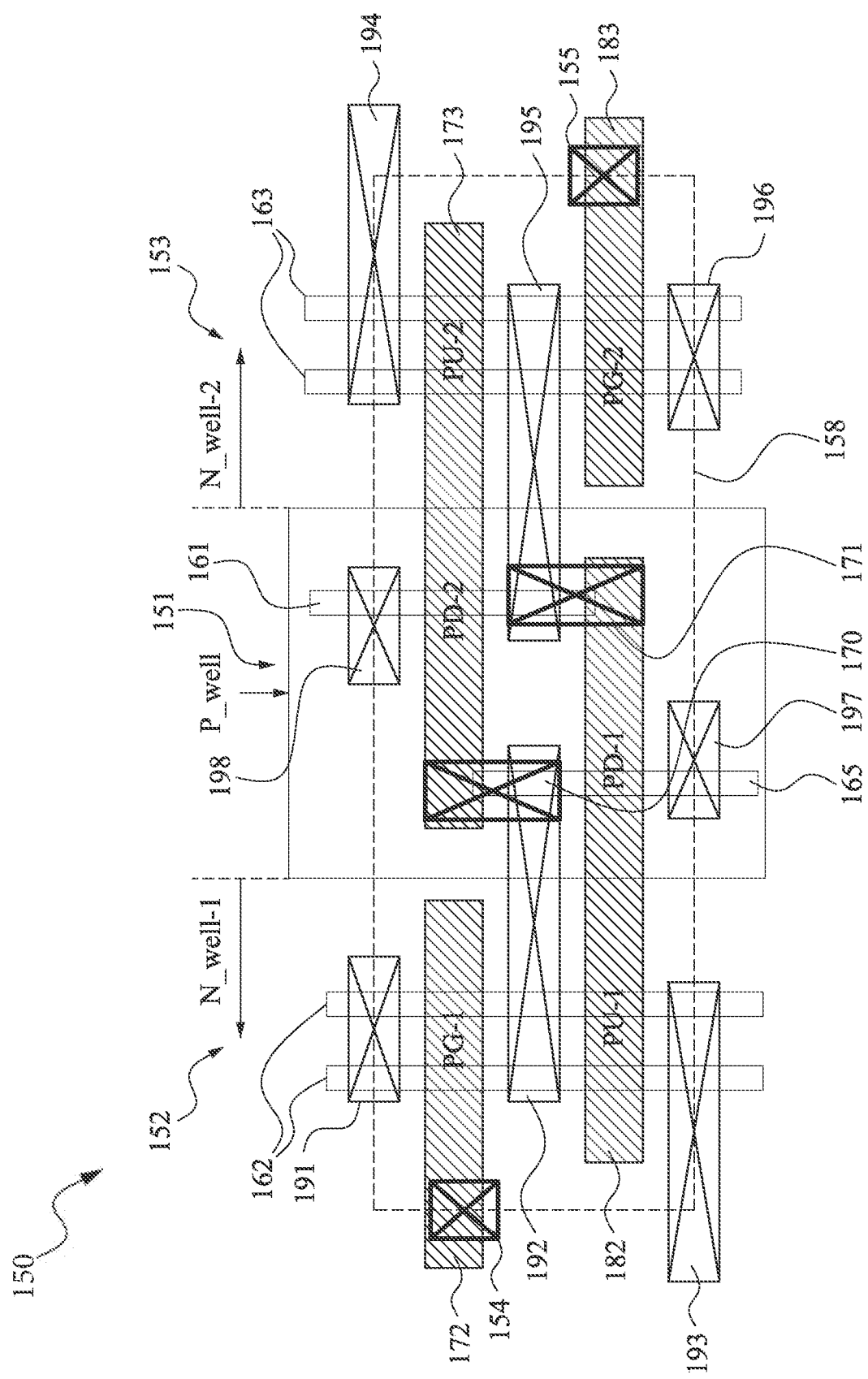
FIG. 1B illustrates another layout of an exemplary SRAM cell in accordance with some embodiments of the present disclosure.

FIG. 1B illustrates another layout of an exemplary SRAM cell 150 in accordance with some embodiments of the present disclosure. The SRAM cell 150 is similar to the SRAM cell 100 in FIG. 1A, except that each of the P-type pass-gate FETs (PG-1 and PG-2) and pull-up FETs (PU-1 and PU-2) may be a multi-fin FET. In other words, each of PG-1, PG-2, PU-1, and PU-2 may include (or be built with) multiple fins in parallel. While the N-type pull-down FETs (PD-1 and PD-2) in the SRAM cell 150 of FIG. 1B are single-fin FETs. In some embodiments not shown here, each of PD-1 and PD-2 may include multiple fins. By adding more fins, the on-state currents (Ion) of P-type FETs are improved, and hence the speed of the SRAM cell 150 may be improved as well.

As shown in FIG. 1B, the SRAM cell 150 is defined within boundaries 158 illustrated in dashed lines. In some implementations, the SRAM cell 150 is formed over a P-type well (P-well) region 151 sandwiched between a first N-type well (N-well) region 152 and a second N-well region 153. The P-well region 151, the first N-well region 152 and the second N-well region 153 are formed over a substrate or a wafer. As shown in FIG. 1B, the SRAM cell 150 includes fin 161 and 165 in the P-well region 151. The fins 161 and 165 include Si and may each be referred to as the Si fin 161 and the Si fin 165. In some implementations, the Si fins 161 and 165 are substantially free of Ge. In other words, no Ge is intentionally embedded in the Si fins 161 and 165 in those implementations. The SRAM cell 150 also includes two fins 162 in the first N-well region 152 and two fins 163 in the second N-well region 153. In some implementations, the fins 162 and 163 include Si and Ge or a SiGe alloy and may be referred to as a SiGe fin, such as the SiGe fins 162 and the SiGe fins 163.

In the embodiments represented by FIG. 1B, the SRAM cell 150 includes a first P-type pass-gate FET ("PG-1"), a first P-type pull-up FET ("PU-1"), a first N-type pull-down FET ("PD-1"), a second N-type pull-down FET ("PD-2"), a second P-type pass-gate FET ("PG-2"), and a second P-type pull-up FET ("PU-2"). In these embodiments, PG-1 and PU-1 are formed over the SiGe fins 162 in the first N-well region 152 and are controlled via and by a gate electrode 172 and a gate electrode 182, respectively. Further, PD-1 and PD-2 are formed over the Si fin 165 and the Si fin 161, respectively in the P-well region 151, and controlled by the gate electrode 182 and the gate electrode 173, respectively. PU-2 and PG-2 are formed over the SiGe fins 163 in the second N-well region 153 and are controlled by the gate electrode 173 and a gate electrode 183 , respectively. It is noted that in these embodiments, PU-1 and PD-1 share the same gate electrode 182. PD-2 and PU-2 share the same gate electrode 173. It is also noted that because PG-1, PG-2, PU-1, and PU-2 are formed over multiple SiGe fins (two shown in FIG. 1B), each of them has multiple SiGe channels.

In some instances, the SRAM cell 150 includes a bit-line (BL) node 191, a storage node 192, a first CVdd node 193, a second CVdd note 194, a storage node bar 195, a bit-line bar (BLB) node 196, a first CVss node 197, and a second CVss node 198. Also, some other nodes such as Word-line contacts 154 and 155 are also illustrated in FIG. 1B. In the present embodiment, a butted contact plug 170 couples the gate electrode 173 to the drain region of the PD-1 controlled by the gate electrode 182. Also, a butted contact plug 171 couples the gate electrode 182 to the drain region of PD-2 controlled via the gate electrode 173. The butted contact plugs 170 and 171 may be replaced with other types of connection structures in some embodiments.

In some implementations represented in FIG. 1B, within the first N-well region 152, the SiGe fins 162 are continuous along the "Y" direction between upper and lower portions of the boundaries 158 that extend along the "X" direction.

Similarly, within the second N-well region 153, the SiGe fin 163 is continuous along the "Y" direction between the upper and lower portions of the boundaries 158 that extend along the "X" direction. As used herein, the reference to upper and lower portions is merely for the ease of reference with respect to FIG. 1B and should not be considered limiting the orientation of the SRAM cell 150. In this regard, the SiGe fins 162 and 163 are continuous in the sense that they are not subject to cut along the "X" direction or are cut or trimmed short on either ends. In contrast, the Si fins 161 and 165 are not continuous within the boundaries 158. For example, while one end (the lower end in FIG. 1B) of the Si fin 165 reaches the lower portion of the boundaries 158, the other end (the upper end in FIG. 1A) does not reach the upper portion of the boundaries 158. As the SiGe fins 162 and 163 in embodiments of the present disclosure are strained, cutting them would release the built-in strain and impact the performance of the first and second P-type pull-up FETs and the first and second P-type pass-gate FETs. Because no lattice strain is intentionally introduced to the Si fins 165 and 161, the Si fins 165 and 161 are not as sensitive to cutting and trimming as the SiGe fins 112 and 113 are.

Figure 2:
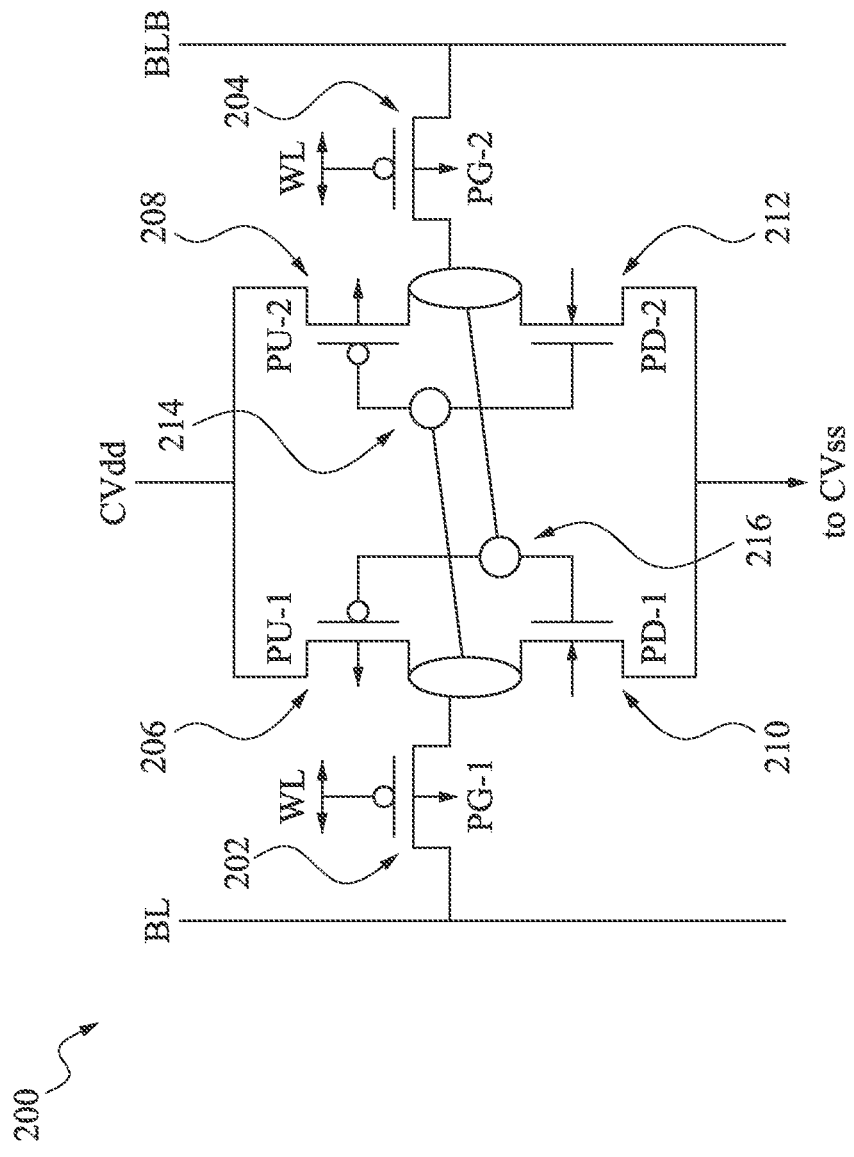
FIGS. 2 and 3 illustrate circuit diagrams of exemplary SRAM cells in accordance with some embodiments of the present disclosure.

FIG. 2 illustrates a circuit diagram of an SRAM cell 200 in accordance with some embodiments of the present disclosure. In some instances, the SRAM cell 200 represents the circuit diagram for the SRAM cell 100 in FIG. 1A and the SRAM cell 150 in FIG. 1B. The SRAM cell 200 includes first and second P-type pass-gate FETs 202 (PG-1) and 204 (PG-2), first and second P-type pull-up FETs 206 (PU-1) and 208 (PU-2), and first and second N-type pull-down FETs 210 (PD-1) and 212 (PD-2). The gates of the first and second P-type pass-gate FETs 202 and 204 are electrically coupled to word-line (WL) that determines whether the SRAM cell 200 is selected or not. In the SRAM cell 200, a memory bit (e.g., a latch or a flip-flop) is formed of the first and second P-type pull-up FETs 206 and 208 and the first and second N-type pull-down FETs 210 and 212 to store a bit of data. The complementary values of the bit are stored in the storage node 214 and the storage node 216. The stored bit can be written into, or read from, the SRAM cell 200 through Bit-line (BL) and Bit-Line Bar (BLB). In this arrangement, the BL and BLB may carry complementary bit-line signals. The SRAM cell 200 is powered through a positive power supply node CVdd that has a positive power supply voltage and is also connected to a power supply voltage CVss, which may be an electrical ground.

In embodiments represented by the SRAM cell 200 in FIG. 2, the sources of the first and second P-type pull-up FETs 206 and 208 are connected to CVdd. The sources of the first and second N-type pull-down FETs 210 and 212 are connected to CVss. The gates of the first P-type pull-up FET 206 and the first N-type pull-down FET 210 are connected to the drains of the second P-type pull-up FET 208 and the second N-type pull-down FET 212 at the storage node 214. The gates of the second P-type pull-up FET 208 and the second N-type pull-down FET 212 are connected to the drains of the first P-type pull-up FET 206 and the first N-type pull-down FET 210 at the storage node 216. A source/drain region of the first P-type pass-gate FET 202 is connected to Bit-line (BL). A source/drain region of the second P-type pass-gate FET 204 is connected to Bit-line bar (BLB).

Figure 3:
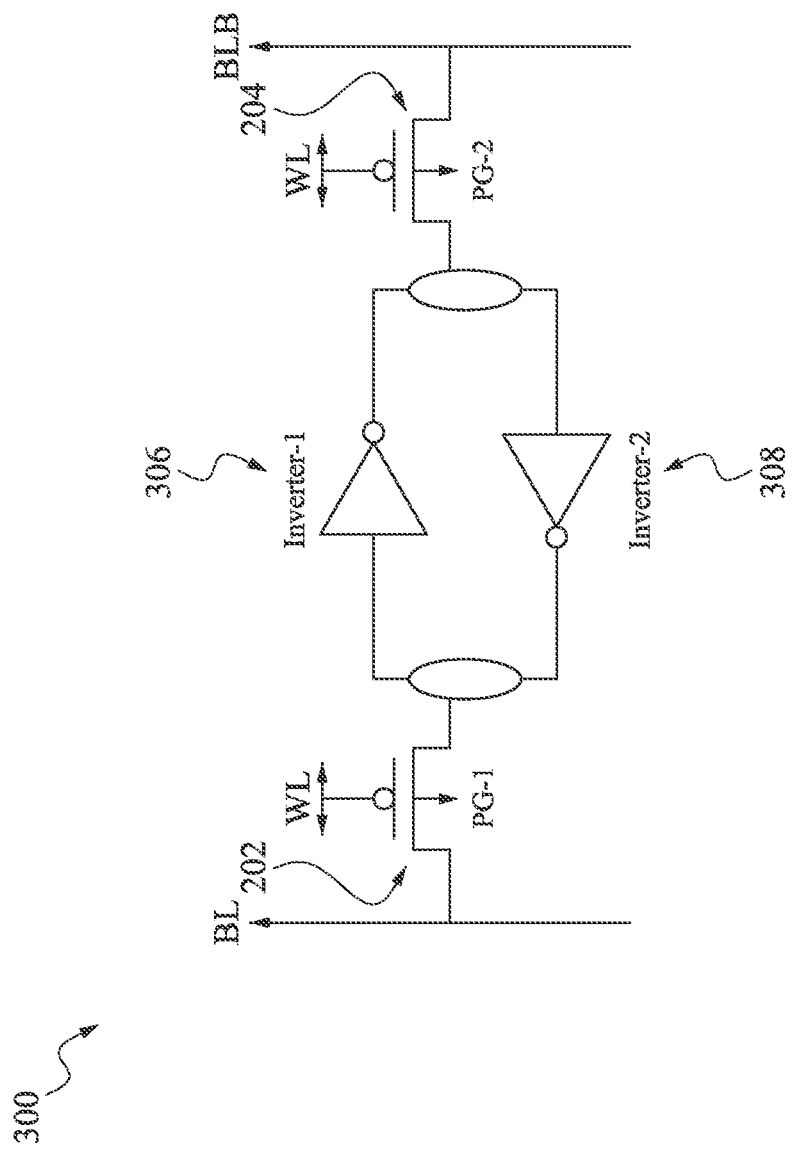

FIG. 3 illustrates a circuit diagram of an SRAM cell 300. The SRAM cell 300 may be an alternative circuit diagram of the SRAM cell 200 in FIG. 2. Specifically, the first inverter 306 (Inverter-1) in FIG. 3 may include the first P-type pull-up FET 206 and the first N-type pull-down FET 210 in FIG. 2 and the second inverter 308 (Inverter-2) may include the second P-type pull-up FET 208 and the second N-type pull-down FET 212 in FIG. 2. Each of the Inverter-1 and Inverter-2 may include additional transistors in some embodiments. The output of first inverter 306 is connected to the first P-type pass-gate FET 202 and the input of the second inverter 308. The output of the second inverter 308 is connected to the second P-type pass-gate FET 204 and the input of the first inverter 306. The first and second inverters (Inverter-1 and Inverter-2) form a memory bit (e.g., a latch or a flip-flop).

Figure 4B:
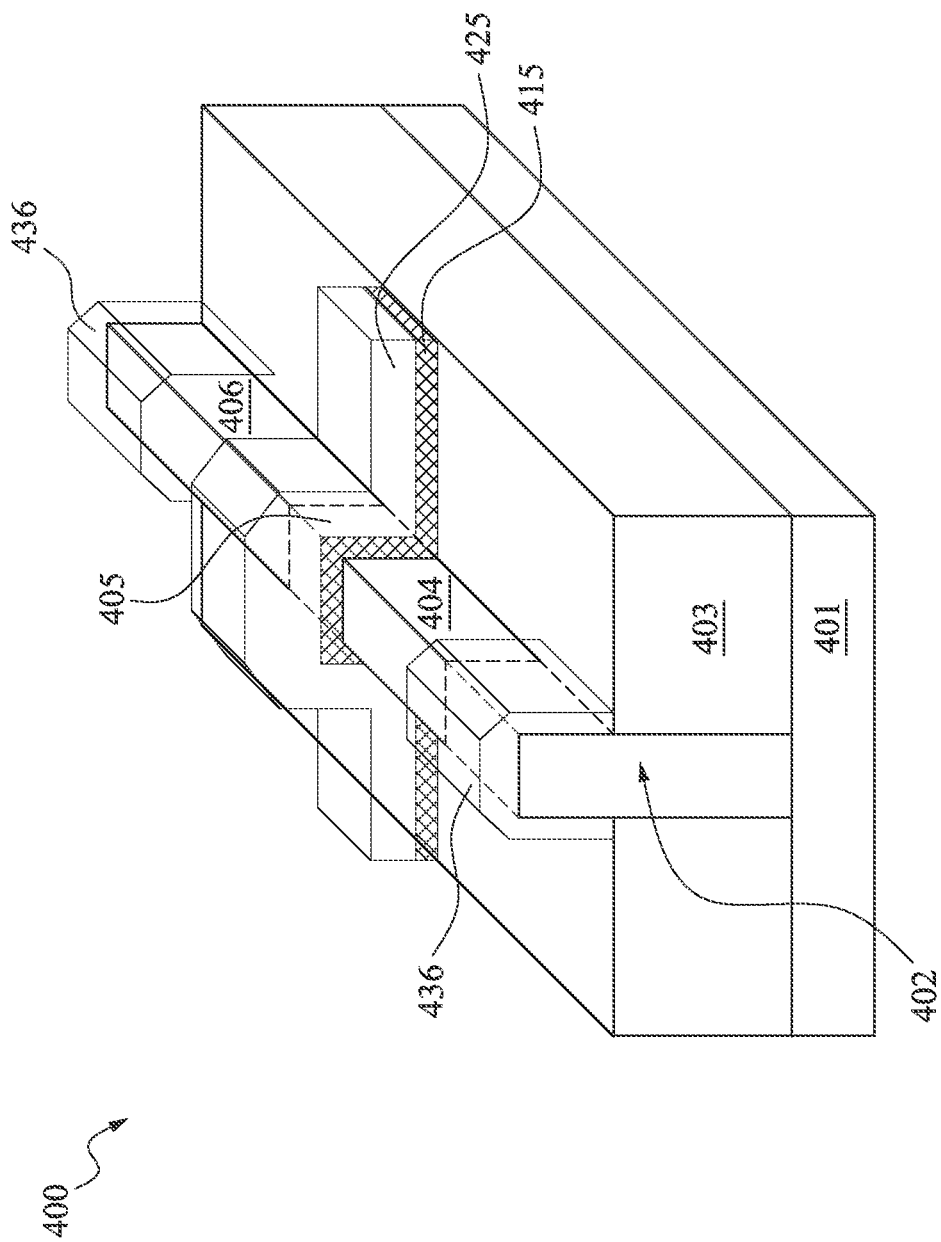

FIGS. 4A and 4B illustrate schematic perspective views of a P-type FET 400, which may be any of the pull-up FETs and the pass-gate FETs in the SRAM cell 100 in FIG. 1A, the SRAM cell 150 in FIG. 1B, and the SRAM cell 200 in FIG. 2. In some embodiments, the P-type FET 400 is formed over a fin 402 in an N-well region 401 of a substrate. In some embodiments of the present disclosure, the fin 402 includes silicon (Si) and germanium (Ge) and may be referred to as the SiGe fin 402. The fin 402 may also be referred to as a fin that includes a SiGe alloy. In the implementations represented by FIG. 4A, isolation regions 403 are formed on opposite sides of the SiGe fin 402. The isolation regions 403 may be shallow trench isolation (STI) regions. In some implementations as shown in FIG. 4A, the SiGe fin 402 includes a channel region 405 sandwiched between a drain region 404 and a source region 406. The SiGe fin 402 extends continuously between the drain region 404 and the channel region 405 as well as between the source region 406 and the channel region 405. The P-type FET 400 therefore has a SiGe channel region 405. A gate dielectric 415 is formed over a top surface and side surfaces of the channel region 405 of the SiGe fin 402. A gate electrode 425 is formed over the gate dielectric 415.

In some embodiments shown in FIGS. 4A and 4B, the source/drain regions 406/404 and the channel region 405 of the P-type FET are different in composition or impurity doping. In the embodiments represented in FIG. 4A, the drain region 404 and the source region 406 of the SiGe fin 402 is implanted with a P-type dopant 435, such as boron (B), gallium (Ga), and indium (In). In some implementations, the drain region 404 and the source region 406 of the SiGe fin 402 is implanted with boron (B) dopants. In some embodiments represented in FIG. 4B, each of the drain region 404 and the source region 406 may include an epitaxial feature 436. While the presence of Ge in the Si lattice creates strain that increases hole mobility, properties of adjacent structures and layers can impose limitations on Ge concentrations in the epitaxial feature 436 and the channel region 405. For example, in some embodiments, a silicide, such as titanium silicide or nickel silicide, is formed at the interface between the epitaxial feature 436 and a source/drain contact. When the Ge concentration in the epitaxial feature 436 is greater than about 70%, such as 75%, the lower Si concentration would impede the formation of the silicide. At the same time, when the Ge concentration in the epitaxial feature 436 is smaller than about 35%, such as 30%, the resulting epitaxial feature 436 would suffer from low conductivity. For another example, in some embodiments, a silicon oxide layer is formed at the interface between the channel and a high-K dielectric layer to mitigate the lattice mismatch between the channel and the high-K dielectric layer. When the Ge concentration in the channel region 405 is greater than about 35%, such as 40%, the lower Si concentration would impede formation of silicon oxide on the channel region 405. At the same time, when the Ge concentration in the channel region is smaller than about 15%, such as 10%, the resulting channel region 405 would suffer from inferior performance, such as low $I_{on}$. Due to the aforementioned example considerations and other considerations, in some implementations, the epitaxial feature 436 includes a SiGe alloy that has a Ge concentration higher than the Ge concentration in the channel region 405. In some instances, the Ge concentration in the epitaxial feature 436 is between about 30% and about 75% and the Ge concentration in the channel region 405 is between about 10% and about 40%. In some instances, the Ge concentration in the epitaxial feature 436 is between about 35% and about 70% and the Ge concentration in the channel region 405 is between about 15% and about 35%. To form the epitaxial feature 436, the drain region 404 and the source regions 406 of the SiGe fin 402 is etched to form recesses and the epitaxial feature 436 are formed in the recesses by epitaxy. By including the epitaxial feature 436 with Ge concentration higher than that of the SiGe fin, the drain 404 and the source region 406 has higher Ge concentration than the channel region 405. In some embodiments, the drain region 404 and the source region 406 of the P-type FET are not only doped with P-type dopants but also include SiGe epitaxial features with Ge concentration higher than the Ge concentration in the channel region 405. In some implementations represented in FIG. 4B, the P-type FET 400 includes raised source/drain regions 404/406 due to the presence of the epitaxial features 436. Because epitaxial features 436 are only present in the source/drain regions 404/406, the height of the source/drain regions 404/406 as measured from the top surface of the isolation (STI) regions 403 is greater than the height of the SiGe channel 405.

Figure 5A:
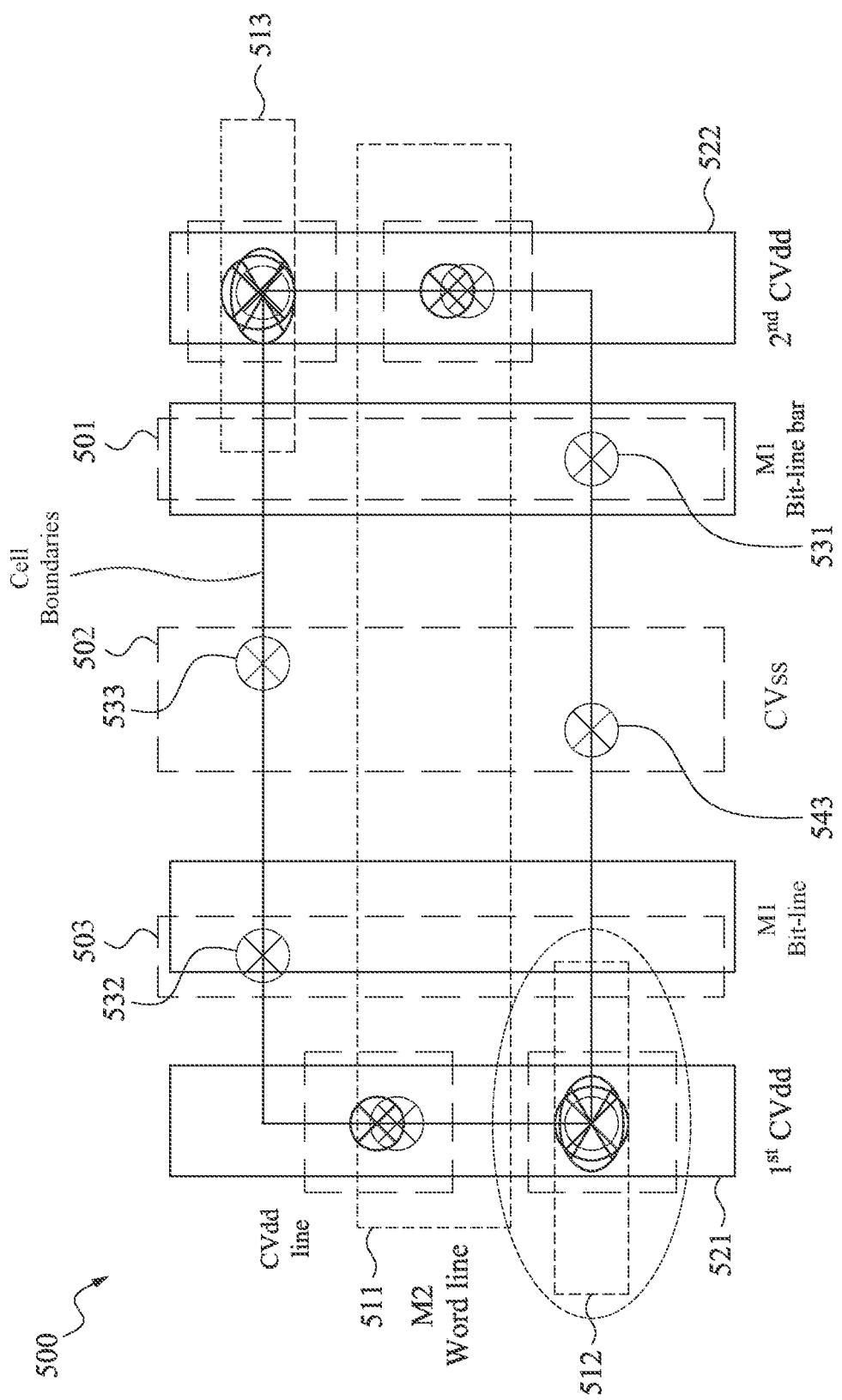
FIG. 5A illustrates a layout of power supply lines and signal lines of an exemplary SRAM cell in accordance with some embodiments of the present disclosure.

A plurality of metallization or metal line layers over an SRAM cell, such as the SRAM cell 100, the SRAM cell 150, are formed over the first and second P-type pull-up FETs, the first and second P-type pass-gate FETs, and the first and second N-type pull-down FETs to provide connections among them. Referring now to FIG. 5A, shown therein a layout 500 of power supply lines and signal lines of an exemplary SRAM cell, which may be the SRAM cell 100 in FIG. 1A or the SRAM cell 150 in FIG. 1B. As used herein, the layout 500 of power supply lines and signal lines may be referred to as the metal line layout 500. In the embodiments represented in FIG. 5A, the metal line layout 500 includes metal lines disposed in three metal layer: the first metal layer M1, a second metal layer M2 over the first metal layer M1, and a third metal layer M3 over the second metal layer M2. The first metal layer M1 at least includes metal lines 501, 502 and 503. The metal line 501 is connected to the bit-line bar (BLB) node by way of a via 531. The metal line 502 is connected to the CVss by means of vias 533 and 543, respectively. The metal line 503 is connected to the bit-line (BL) node by means of a via 532. The second metal layer M2 at least includes metal lines 511, 512 and 513. The metal line 511 is connected to the gate electrodes for the first and second P-type pass-gate FETs by means of word-line (WL) contacts. The metal lines 512 and 513 are CVdd landing pads and are connected to the CVdd nodes. The third metal layer M3 at least includes metal lines 521 and 522. The metal line 521 is connected to the CVdd node by way of the CVdd landing pad 512 and may be referred to as the first CVdd conductor. The metal line 522 is connected to the CVdd node by way of the CVdd landing pad 513 and may be referred to as the second CVdd conductor.

Figure 5B:
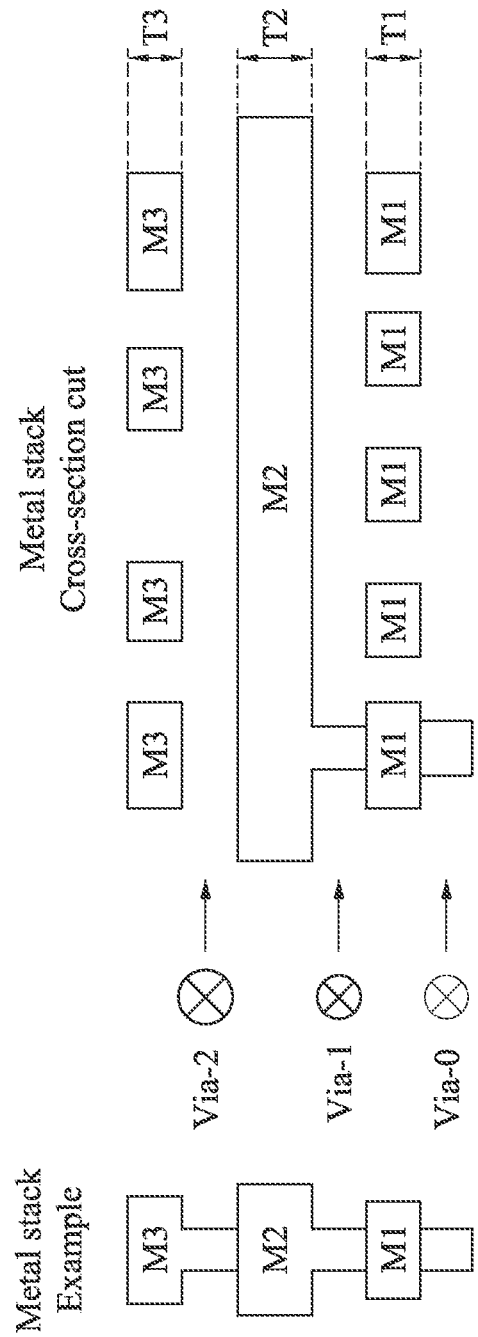
FIG. 5B illustrates a schematic diagram of metal layers in the layout of FIG. 5A.

FIG. 5B illustrates a schematic diagram of metal layers M1, M2 and M3 in the layout of FIG. 5A. As described in FIG. 5A, the first metal layer M1 includes at least the metal lines 501, 502 and 503; the second metal layer M2 includes at least the metal lines 511, 512 and 513; and the third metal layer M3 includes at least the metal lines 521 and 522. The first metal layer M1 has a first thickness T1, the second metal layer has a second thickness T2, and the third metal layer has a third thickness T3. In some embodiments, the second thickness T2 is greater than the first thickness T1 and the third thickness T3. In those embodiments, the thicker second metal layer can have lower resistance and therefore can reduce power consumption and voltage drops along a length of the second metal layer.

Figure 6:
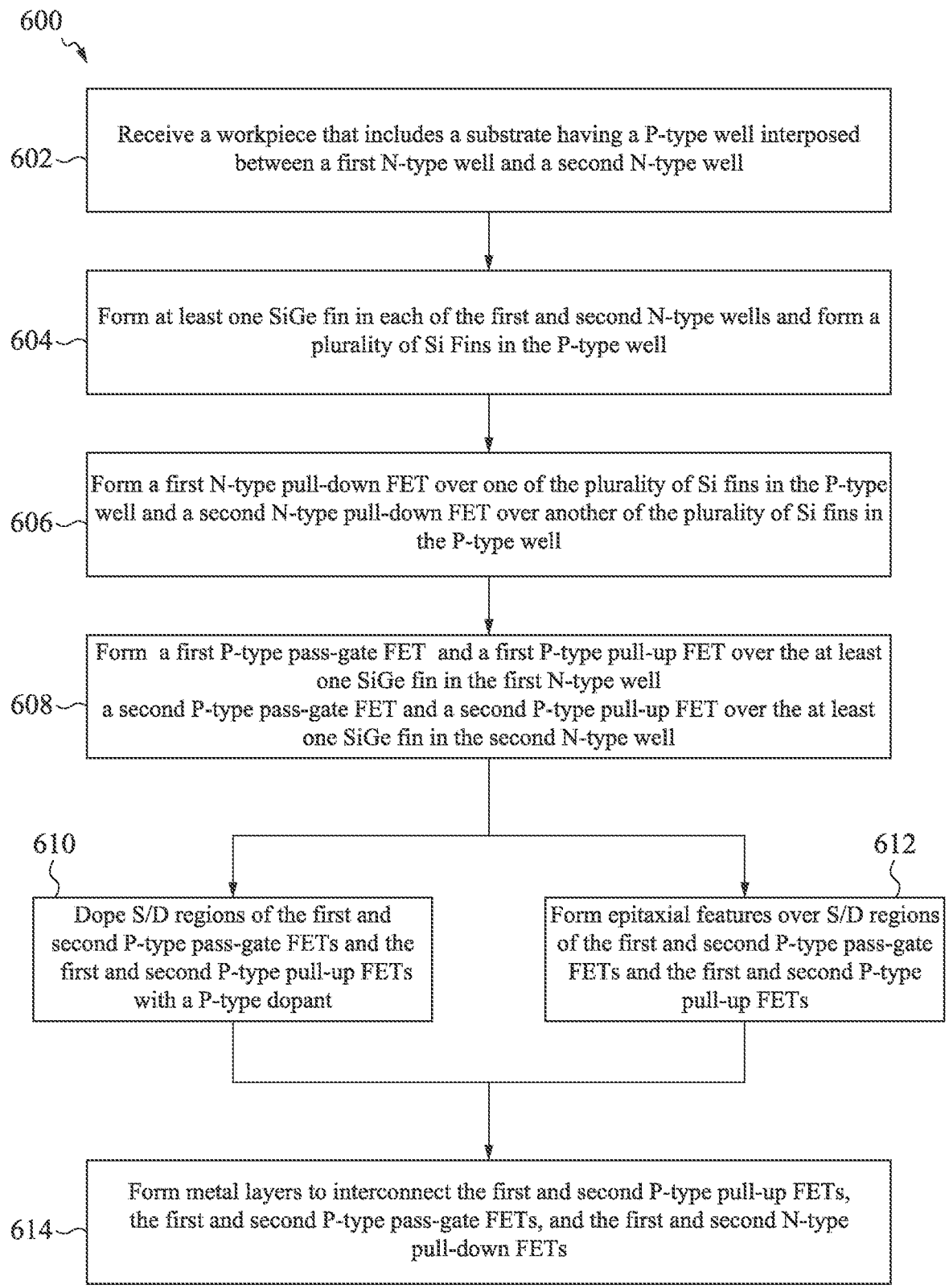
FIG. 6 is a flowchart illustrating a method of forming an SRAM cell according to an embodiment of the present disclosure.

FIG. 6 is a flowchart illustrating a method 600 of forming an SRAM cell, such as the SRAM cell 100 in FIG. 1A and the SRAM cell 150 in FIG. 1B. The method 600 is merely an example, and is not intended to limit the present disclosure beyond what is explicitly recited in the claims. Additional operations can be provided before, during, and after the method 600, and some operations described can be replaced, eliminated, or moved around for additional embodiments of the method 600. Operations of the method 600 will be described below conjunction with FIGS. 1A, 1B, 4A, 4B, 5A, and 5B.

At operation 602 of the method 600, a workpiece is received. In some embodiments, the workpiece can include a substrate having a P-well region sandwiched between a first N-well region and a second N-well region. An exemplary arrangement of the P-well region, the first and second N-well regions is illustrated in FIGS. 1A and 1B. At operation 604 of the method 600, at least one SiGe fin is formed in each of the first and second N-well region and a plurality of Si fins is formed in the P-well region. The SiGe fin is a fin that includes a first SiGe alloy of silicon (Si) and germanium (Ge). The first SiGe alloy includes a first Ge concentration. FIGS. 4A and 4B illustrate a SiGe fin (the SiGe fin 402) in an N-well region. In some embodiments, the formation of the SiGe and Si fin are carried out by epitaxy processes along with other appropriate processes. At operation 606 of the method 600, a first N-type pull-down FET is formed over one of the plurality of Si fins in the P-well and a second N-type pull-down FET is formed over another of the plurality of Si fins. At operation 608 of the method 600, a first P-type pass-gate FET and a first P-type pull-up FET are formed over the at least one SiGe fin in the first N-well region and a second P-type pass-gate FET and a second P-type pull-up FET are formed over the at least one SiGe fin in the second N-well region.

The method 600 then bifurcates into operation 610 and operation 612. In some embodiments, the method 600 can proceed to one of the operations 610 and 612 separately. In some other embodiments, the method 600 can proceed to operations 610 and 612 simultaneously or sequentially. At operation 610, source/drain regions of the first and second P-type pass-gate FETs, and the first and second P-type pull-up FETs are doped with a P-type dopant such as boron, gallium, and indium. In some embodiments, the P-type dopant is boron. An example of this operation 610 is illustrated in FIG. 4A. At operation 612, epitaxial features are formed over the source/drain regions of the first and second P-type pass-gate FETs and the first and second P-type pull-up FETs to become part of these source/drain regions. In some embodiments, the epitaxial features are formed of a second SiGe alloy of silicon (Si) and germanium (Ge). The second SiGe alloy includes a second Ge concentration higher than the first Ge concentration. Thus, the P-type pass-gate FETs and pull-up FETs formed using the method 600 include channel regions having the first Ge concentration and the epitaxial features (in the source/drain regions) having the second Ge concentration. As described above, the selection of ranges for the first and second Ge concentration is based on several considerations, which will not be repeated here for brevity. An example of this operation 612 is illustrated in FIG. 4B. In some instances, operations 610 and 612 may be performed sequentially when the epitaxial features are formed and then subject to P-type impurity doping processes, such as boron implantation. In some other instances, operations 610 and 612 may be performed simultaneously when the epitaxial features are subject to in-situ doping while they are being formed by epitaxy. At operation 614, metal layers, such as the first, second and third metal layers described in conjunction with FIGS. 5A and 5B, are formed to interconnect the first and second P-type pass-gate FETs, the first and second P-type pull-up FETs, and the first and second N-type pull-down FETs.

Based on the above discussions, it can be seen that the present disclosure offers advantages over conventional SRAM cells. It is understood, however, that other embodiments may offer additional advantages, and not all advantages are necessarily disclosed herein, and that no particular advantage is required for all embodiments. One advantage is that the continuous SiGe fins for the P-type FETs in the SRAM cell reduce unfavorable release of the built-in strain in the SiGe fin. The unfavorable strain release may cause performance degradation in the P-type FETs. While both the source/drain regions and the channel region of P-type FETs in the disclosed SRAM cells are formed of SiGe fin, the source/drain regions of the P-type FETs in the disclosed SRAM cell is different from the SiGe channel region in impurity doping and Ge concentration. According to various embodiments of the present disclosure, doping the source/drain region with a P-type dopant such as B or forming an epitaxial feature over the source/drain region of the P-type FET can improve $I_{on}$ performance and provide favorable speed gain. In these embodiments, the Ge concentration of the epitaxial features is higher than the Ge concentration in the SiGe fin and the SiGe channel.

In one exemplary aspect, the present disclosure is directed to a static random access memory (SRAM) cell device. The device includes a P-type well (P-well) region, a first N-type well (N-well) region and a second N-well region on opposite sides of the P-well region, a plurality of Si fins in the P-well region, at least one SiGe fin in the first N-well region, at least one SiGe fin in the second N-well region, a first pass-gate field effect transistor (FET) and a first pull-up FET formed over the at least one SiGe fin in the first N-well region, a second pass-gate FET and a second pull-up FET formed over the at least one SiGe fin in the second N-well region, a first pull-down FET formed over one of the plurality of Si fins in the P-well region, and a second pull-down FET formed over another of the plurality of Si fins in the P-well region. The channel regions of the first and second pass-gate FETs and the first and second pull-up FETs include first SiGe alloy, and source/drain regions of the first and second pass-gate FETs and the first and second pull-up FETs include second SiGe alloy. The first SiGe alloy is different from the second SiGe alloy in composition or impurity doping.

In an embodiment of the device, the source/drain regions of the first and second pass-gate FETs and the first and second pull-up FETs include a P-type dopant and the channel regions of the first and second pass-gate FETs and the first and second pull-up FETs are substantially free of the P-type dopant.

In another embodiment of the device, the source/drain regions of the first and second pass-gate FETs and the first and second pull-up FETs include epitaxial features. The channel regions of the first and second pass-gate FETs and the first and second pull-up FETs comprise a first Ge concentration; and the epitaxial features comprise a second Ge concentration greater than the first Ge concentration. In an embodiment, the first Ge concentration is between about 10% and about 40%. In another embodiment, the second Ge concentration is between about 30% and about 75%.

In yet another embodiment of the device, the SRAM cell further includes a first metal layer comprising a bit-line (BL) and a bit-line bar (BLB) of the SRAM cell, a second metal layer over the first metal layer, the second metal layer comprising a word line (WL) coupled to gates of the first and second pass-gate FETs, and a third metal layer over the second metal layer, the third metal layer comprising power supply (Vdd) conductors electrically coupled to source regions of the first and second pull-up FETs. The second metal layer comprises a thickness greater than a thickness of the first metal layer and a thickness of the third metal layer.

In a further embodiment of the device, the device includes a first boundary and a second boundary parallel to the first boundary. The at least one SiGe fin in the first N-well region is continuous between the first boundary and the second boundary; and the at least one SiGe fin in the second N-well region is continuous between the first boundary and the second boundary.

In another exemplary aspect, the present disclosure is directed to a static random access memory (SRAM) cell device. The device includes a first P-type pull-up field effect transistor (FET) and a first N-type pull-down FET, the first P-type pull-up FET and the first N-type pull-down FET forming a first inverter; a second P-type pull-up FET and a second N-type pull-down FET, the second P-type pull-up FET and the second N-type pull-down FET forming a second inverter; a first P-type pass-gate FET coupled to an output of the first inverter and an input of the second inverter; and a second P-type pass-gate FET coupled to an output of the second inverter and an input of the first inverter. Each of the first and second P-type pass-gate FETs and the first and second P-type pull-up FETs comprise a fin having a SiGe channel region and two SiGe source/drain regions sandwiching the SiGe channel region. The SiGe channel region comprises a first Ge concentration and the SiGe source/drain region comprises a second Ge concentration greater than the first Ge concentration.

In an embodiment of the device, the first Ge concentration is between about 15% and about 35%. In another embodiment of the device, the second Ge concentration is between about 35% to about 70%. In yet another embodiment of the device, the SiGe source/drain region comprises a P-type dopant and the SiGe channel region is substantially free of the P-type dopant. In an embodiment, the P-type dopant is boron.

In still another embodiment of the device, each of the first and second N-type pull-down FETs comprise another fin having a Si channel region and two Si source/drain regions sandwiching the Si channel region.

In a further embodiment of the device, the SRAM cell further includes a first metal layer comprising a bit-line (BL) and a bit-line bar (BLB) of the SRAM cell, a second metal layer over the first metal layer, the second metal layer comprising a word line (WL) coupled to gates of the first and second P-type pass-gate FETs, and a third metal layer over the second metal layer, the third metal layer comprising power supply (Vdd) conductors electrically coupled to source regions of the first and second P-type pull-up FETs. The second metal layer comprises a thickness greater than a thickness of the first metal layer and a thickness of the third metal layer.

In yet another exemplary aspect, the present disclosure is directed to a static random access memory (SRAM) cell device. The device includes a first P-type pass-gate field effect transistor (FET) including a gate, a second P-type pass-gate FET including a gate, a first P-type pull-up FET including a source region, a second P-type pull-up FET including a source region, a first N-type pull-down FET, a second N-type pull-down FET, a first metal layer comprising a bit-line (BL) and a bit-line bar (BLB) of the SRAM cell, a second metal layer over the first metal layer, the second metal layer comprising a word line (WL) coupled to the gates of the first and second P-type pass-gate FETs, and a third metal layer over the second metal layer, the third metal layer comprising power supply (Vdd) conductors electrically coupled to the source regions of the first and second P-type pull-up FETs. The second metal layer comprises a thickness greater than a thickness of the first metal layer and a thickness of the third metal layer.

In an embodiment of the device, the first P-type pass-gate FET and the first P-type pull-up FET are formed over at least one SiGe fin in a first N-type well (N-well) region of the SRAM cell. The second P-type pass-gate FET and the second P-type pull-up FET are formed over at least one SiGe fin in a second N-well region of the SRAM cell. The first and second N-type pull-down FETs are each formed over a Si fin in a P-type well (P-well) region of the SRAM cell. The P-well region is disposed between the first N-well region and the second N-well region.

In another embodiment of the device, source/drain regions of the first and second P-type pass-gate FETs and the first and second P-type pull-up FETs include epitaxial features. Channel regions of the first and second P-type pass-gate FETs and the first and second P-type pull-up FETs comprise a first Ge concentration. The epitaxial features comprise a second Ge concentration greater than the first Ge concentration. In an embodiment, the first Ge concentration is between about 10% and about 40%; the second Ge concentration is between about 30% to about 75%.

In yet another embodiment of the device, source/drain regions of the first and second P-type pass-gate FETs and the first and second P-type pull-up FETs include a P-type dopant and channel regions of the first and second P-type pass-gate FETs and the first and second P-type pull-up FETs are substantially free of the P-type dopant. In an embodiment, the P-type dopant is boron.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit-line conductor and word line conductor, one can achieve different resistances for the conductors. However, other techniques to vary the resistances of the metal conductors may also be utilized as well.

What is claimed is:

1. A Static Random Access Memory (SRAM) cell comprising:
   a P-type well (P-well) region;
   a first N-type well (N-well) region and a second N-well region on opposite sides of the P-well region;
   a plurality of Si fins in the P-well region;
   at least one SiGe fin in the first N-well region;
   at least one SiGe fin in the second N-well region;
   a first pass-gate field effect transistor (FET) and a first pull-up FET formed over the at least one SiGe fin in the first N-well region;
   a second pass-gate FET and a second pull-up FET formed over the at least one SiGe fin in the second N-well region;
   a first pull-down FET formed over one of the plurality of Si fins in the P-well region; and
   a second pull-down FET formed over another of the plurality of Si fins in the P-well region,
   wherein channel regions of the first and second pass-gate FETs and the first and second pull-up FETs include first SiGe alloy, and source/drain regions of the first and second pass-gate FETs and the first and second pull-up FETs include second SiGe alloy, wherein the first SiGe alloy is different from the second SiGe alloy in composition or impurity doping.

2. The SRAM cell of claim 1, wherein the source/drain regions of the first and second pass-gate FETs and the first and second pull-up FETs include a P-type dopant and the channel regions of the first and second pass-gate FETs and the first and second pull-up FETs are substantially free of the P-type dopant.

3. The SRAM cell of claim 1,
   wherein the source/drain regions of the first and second pass-gate FETs and the first and second pull-up FETs include epitaxial features,
   wherein the channel regions of the first and second pass-gate FETs and the first and second pull-up FETs comprise a first Ge concentration,
   wherein the epitaxial features comprise a second Ge concentration greater than the first Ge concentration.

4. The SRAM cell of claim 3, wherein the first Ge concentration is between about 10% and about 40%.

5. The SRAM cell of claim 3, wherein the second Ge concentration is between about 30% and about 75%.

6. The SRAM cell of claim 1, further comprising:
   a first metal layer comprising a bit-line (BL) and a bit-line bar (BLB) of the SRAM cell;
   a second metal layer over the first metal layer, the second metal layer comprising a word line (WL) coupled to gates of the first and second pass-gate FETs; and
   a third metal layer over the second metal layer, the third metal layer comprising power supply (Vdd) conductors electrically coupled to source regions of the first and second pull-up FETs,
   wherein the second metal layer comprises a thickness greater than a thickness of the first metal layer and a thickness of the third metal layer.

7. The SRAM cell of claim 1,
   wherein the SRAM cell comprises a first boundary and a second boundary parallel to the first boundary,
   wherein the at least one SiGe fin in the first N-well region is continuous between the first boundary and the second boundary,
   wherein the at least one SiGe fin in the second N-well region is continuous between the first boundary and the second boundary.

8. A Static Random Access Memory (SRAM) cell comprising:
   a first P-type pull-up field effect transistor (FET) and a first N-type pull-down FET, the first P-type pull-up FET and the first N-type pull-down FET forming a first inverter;

a second P-type pull-up FET and a second N-type pull-down FET, the second P-type pull-up FET and the second N-type pull-down FET forming a second inverter;

a first P-type pass-gate FET coupled to an output of the first inverter and an input of the second inverter; and a second P-type pass-gate FET coupled to an output of the second inverter and an input of the first inverter, wherein each of the first and second P-type pass-gate FETs and the first and second P-type pull-up FETs comprise a fin having a SiGe channel region and two SiGe source/drain regions sandwiching the SiGe channel region, wherein the SiGe channel region comprises a first Ge concentration and the SiGe source/drain region comprises a second Ge concentration greater than the first Ge concentration.

9. The SRAM cell of claim 8, wherein the first Ge concentration is between about 15% and about 35%.

10. The SRAM cell of claim 8, wherein the second Ge concentration is between about 35% to about 70%.

11. The SRAM cell of claim 8, wherein the SiGe source/drain region comprises a P-type dopant and the SiGe channel region is substantially free of the P-type dopant.

12. The SRAM cell of claim 11, wherein the P-type dopant is boron.

13. The SRAM cell of claim 8, wherein each of the first and second N-type pull-down FETs comprise another fin having a Si channel region and two Si source/drain regions sandwiching the Si channel region.

14. The SRAM cell of claim 8, further comprising:

a first metal layer comprising a bit-line (BL) and a bit-line bar (BLB) of the SRAM cell;

a second metal layer over the first metal layer, the second metal layer comprising a word line (WL) coupled to gates of the first and second P-type pass-gate FETs; and a third metal layer over the second metal layer, the third metal layer comprising power supply (Vdd) conductors electrically coupled to source regions of the first and second P-type pull-up FETs, wherein the second metal layer comprises a thickness greater than a thickness of the first metal layer and a thickness of the third metal layer.

15. A Static Random Access Memory (SRAM) cell comprising:

a first P-type pass-gate field effect transistor (FET) including a gate;

a second P-type pass-gate FET including a gate;

a first P-type pull-up FET including a source region;

a second P-type pull-up FET including a source region;

a first N-type pull-down FET;

a second N-type pull-down FET;

a first metal layer comprising a bit-line (BL) and a bit-line bar (BLB) of the SRAM cell;

a second metal layer over the first metal layer, the second metal layer comprising a word line (WL) coupled to the gates of the first and second P-type pass-gate FETs; and a third metal layer over the second metal layer, the third metal layer comprising power supply (Vdd) conductors electrically coupled to the source regions of the first and second P-type pull-up FETs, wherein the second metal layer comprises a thickness greater than a thickness of the first metal layer and a thickness of the third metal layer as measured along a direction perpendicular to a top surface of the first metal layer.

16. The SRAM cell of claim 15, wherein the first P-type pass-gate FET and the first P-type pull-up FET are formed over at least one SiGe fin in a first N-type well (N-well) region of the SRAM cell, wherein the second P-type pass-gate FET and the second P-type pull-up FET are formed over at least one SiGe fin in a second N-well region of the SRAM cell, wherein the first and second N-type pull-down FETs are each formed over a Si fin in a P-type well (P-well) region of the SRAM cell, wherein the P-well region is disposed between the first N-well region and the second N-well region.

17. The SRAM cell of claim 15, wherein source/drain regions of the first and second P-type pass-gate FETs and the first and second P-type pull-up FETs include epitaxial features, wherein channel regions of the first and second P-type pass-gate FETs and the first and second P-type pull-up FETs comprise a first Ge concentration, wherein the epitaxial features comprise a second Ge concentration greater than the first Ge concentration.

18. The SRAM cell of claim 17, wherein the first Ge concentration is between about 10% and about 40%, wherein the second Ge concentration is between about 30% to about 75%.

19. The SRAM cell of claim 15, wherein source/drain regions of the first and second P-type pass-gate FETs and the first and second P-type pull-up FETs include a P-type dopant and channel regions of the first and second P-type pass-gate FETs and the first and second P-type pull-up FETs are substantially free of the P-type dopant.

20. The SRAM cell of claim 19, wherein the P-type dopant is boron.

* * * * *